(12) United States Patent
Zhao et al.

(10) Patent No.: US 11,528,040 B2
(45) Date of Patent: Dec. 13, 2022

(54) DATA RETRANSMISSION METHOD AND APPARATUS TO OBTAIN INFORMATION TO BE TRANSMITTED AND TO PERFORM POLAR ENCODING ON THE INFORMATION

(71) Applicant: HUAWEI TECHNOLOGIES CO., LTD., Guangdong (CN)

(72) Inventors: Mingmin Zhao, Shenzhen (CN); Gongzheng Zhang, Hangzhou (CN); Chen Xu, Hangzhou (CN); Rong Li, Hangzhou (CN)

(73) Assignee: HUAWEI TECHNOLOGIES CO., LTD., Guangdong (CN)

(*) Notice: Subject to any disclaimer, the term of this patent is extended or adjusted under 35 U.S.C. 154(b) by 176 days.

(21) Appl. No.: 16/849,643

(22) Filed: Apr. 15, 2020

(65) Prior Publication Data

US 2020/0244291 A1 Jul. 30, 2020

Related U.S. Application Data

(63) Continuation of application No. PCT/CN2018/107290, filed on Sep. 25, 2018.

(30) Foreign Application Priority Data

Nov. 2, 2017 (CN) .................... 201711065804.X

(51) Int. Cl.
*H03M 13/13* (2006.01)
*H03M 13/00* (2006.01)
*H04L 1/18* (2006.01)

(52) U.S. Cl.
CPC ....... *H03M 13/6362* (2013.01); *H03M 13/13* (2013.01); *H03M 13/6577* (2013.01); *H04L 1/1816* (2013.01)

(58) Field of Classification Search
CPC ............. H03M 13/6362; H03M 13/13; H03M 13/6577; H04L 1/1816
See application file for complete search history.

(56) References Cited

U.S. PATENT DOCUMENTS

| 10,009,146 B2* | 6/2018 | Shen ................. H03M 13/2739 |
| 10,313,057 B2* | 6/2019 | Lin .................... H03M 13/2933 |

(Continued)

FOREIGN PATENT DOCUMENTS

| CN | 101217337 A | 7/2008 |
| CN | 106230553 A | 12/2016 |

(Continued)

OTHER PUBLICATIONS

Huawei, HiSilicon, IR-HARQ scheme for polar codes. 3GPP TSG RAN WG1 NR Ad-Hoc Meeting, Spokane, USA, Jan. 16-20, 2017, R1-1700406, 4 pages.

(Continued)

*Primary Examiner* — Justin R Knapp
(74) *Attorney, Agent, or Firm* — Womble Bond Dickinson (US) LLP

(57) ABSTRACT

This disclosure provides a data retransmission method and apparatus. The method includes: A transmitting device obtains information to be transmitted for a $t^{th}$ time, where the information to be transmitted for the $t^{th}$ time includes $R_t$ extension locations and information to be transmitted for a $(t-1)^{th}$ time, and the extension locations include $M_t$ information bits and $L_t$ check bits corresponding to the $M_t$ information bits. The transmitting device then performs Polar encoding on the information to be transmitted for the $t^{th}$ time, to obtain a codeword after the Polar encoding, obtains a codeword for $(t-1)^{th}$ retransmission based on the codeword after the Polar encoding, and transmits the codeword for $(t-1)^{th}$ retransmission. A receiving device performs polar decoding after receiving the codeword for $(t-1)^{th}$ (Continued)

retransmission, to obtain a decoding result of codewords for t times of transmission. By performing, on an encoding side, check encoding on the information bits in an extension part, a decoding path can be reduced in a decoding process, thereby greatly reducing decoding complexity, and reducing storage overheads and calculation overheads.

20 Claims, 7 Drawing Sheets

(56) References Cited

U.S. PATENT DOCUMENTS

| | | | | |
|---|---|---|---|---|
| 10,756,853 | B2* | 8/2020 | Zhang | H04L 1/0041 |
| 2020/0099469 | A1* | 3/2020 | Jiang | H04L 1/0041 |
| 2021/0329626 | A1* | 10/2021 | Papasakellariou | H04L 1/18 |

FOREIGN PATENT DOCUMENTS

| | | |
|---|---|---|
| CN | 106817195 A | 6/2017 |
| CN | 107026709 A | 8/2017 |
| CN | 107294652 A | 10/2017 |
| CN | 106464446 B | 8/2019 |
| WO | 2017156792 A1 | 9/2017 |
| WO | 2017176309 A1 | 10/2017 |

OTHER PUBLICATIONS

Huawei, HiSilicon, HARQ scheme for polar codes. 3GPP TSG RAN WG1 Meeting #87, Reno, USA, Nov. 14-18, 2016, R1-1611255, 25 pages.

Ericsson, Investigation of HARQ Design for Polar Codes. 3GPP TSG RAN WG1 Meeting #87, Reno, CA, USA, Nov. 10-14, 2016, R1-1611320, 4 pages.

B. Li, D. Tse, K. Chen and H. Shen, "Capacity-achieving rateless polar codes," IEEE International Symposium on Information Theory (ISIT), Barcelona, 2016, pp. 46-50, total 5 pages.

* cited by examiner

DATA RETRANSMISSION METHOD AND APPARATUS TO OBTAIN INFORMATION TO BE TRANSMITTED AND TO PERFORM POLAR ENCODING ON THE INFORMATION

CROSS-REFERENCE TO RELATED APPLICATIONS

This application is a continuation of International Application No. PCT/CN2018/107290, filed on Sep. 25, 2018, which claims priority to Chinese Patent Application No. 201711065804.X, filed on Nov. 2, 2017. The disclosures of the aforementioned applications are hereby incorporated by reference in their entireties.

TECHNICAL FIELD

This disclosure relates to the wireless communications field, and in particular, to a data retransmission method and apparatus.

BACKGROUND

At present, as a next generation wireless communications technology, a fifth generation mobile communications technology (5G) has been widely valued and researched in the 3rd generation partnership project (3GPP) and various other international standardization organizations. An application scenario of a 5G mobile communications system is as follows: for example, ultra-low latency and ultra-reliable communications (uRLLC) has higher requirements, such as high reliability and low latency. In a communications system, channel encoding is usually used to improve data transmission reliability and ensure communication quality, and a polar code is the first channel encoding method that can be strictly proved to "reach" a channel capacity. The Polar code is a linear block code, a generator matrix of the Polar code is $G_N$, an encoding process of the Polar code is $x_1^N = u_1^N G_N$, where $u_1^N = (u_1, u_2, \ldots, u_N)$ is a binary row vector, and a length of the Polar code is N (namely, a code length). In addition, $G_N = B_N F_2^{\otimes (log_2(N))}$, and $$F_2 = \begin{bmatrix} 1 & 0 \\ 1 & 1 \end{bmatrix}$$

herein is an N×N transposed matrix, for example, a bit reversal order transposed matrix. It should be noted that $B^N$ is an optional matrix, and may not be multiplied by $B^N$ in some scenarios. $F_2^{\otimes (log_2(N))}$ is defined as a Kronecker product of $log_2 N$ matrices $F_2$. $x_1^N$ is a bit after encoding (also referred to as a codeword), and the bit after encoding is obtained by multiplying $u_1^N$ and the generator matrix $G^N$ together. A multiplication process is an encoding process. In a polar encoding process, some bits in $u_1^N$ are used to carry information, and are referred to as information bits, and a set of indexes of the information bits is denoted as A. Some other bits in $u_1^N$ are set to fixed values that are agreed on by a transmit end and a receive end in advance, and are referred to as frozen bits. A set of indexes of the frozen bits is represented by a complementary set $A^c$ of A. The frozen bits are usually set to 0. A sequence of the frozen bits may be randomly set provided that the transmit end and the receive end agree in advance. A construction process of the Polar code is a selection process of the set A. This determines performance of the Polar code.

In a communications application insensitive to a system delay, a hybrid automatic repeat request (HARQ) is a common transmission method used to improve a system throughput. There are a plurality of Polar-code-based HARQ manners, and a common Polar-code-based HARQ manner is an incremental redundancy (IR) HARQ. Specifically, in this IR HARQ manner, a transmitting device performs cyclic redundancy check (CRC) encoding on to-be-transmitted data during initial transmission, and encodes the to-be-transmitted data into a relatively short Polar code at a corresponding code rate. In each retransmission, extension is performed based on Polar code lengths in previous transmission. Data of an unreliable information location during the initial transmission is placed in an extension location. Polar encoding is performed on the extension location to generate an incremental redundancy bit, to obtain extension information after encoding, and the extension information after encoding is sent to a receiving device as retransmission information. The receiving device combines the received retransmission information with initially transmitted information and retransmitted information to form a long code for decoding.

However, in a currently used IR HARQ manner, as a quantity of retransmission times increases, a code length of a combined long code also increases continuously. If an existing CRC-aided successive cancellation list (CASCL) is used for decoding, there is a problem of excessively high storage overheads and relatively high decoding complexity.

SUMMARY

This disclosure provides a data retransmission method and apparatus, to resolve a problem of excessively high storage overheads and relatively high decoding complexity as a quantity of retransmission times increases.

According to a first aspect, this disclosure provides a data retransmission method. The method includes:

obtaining, by a transmitting device, information to be transmitted for a $t^{th}$ time, where the information to be transmitted for the $t^{th}$ time includes $R_t$ extension locations and information to be transmitted for a $(t-1)^{th}$ time, and the extension locations include $M_t$ information bits and $L_t$ check bits corresponding to the $M_t$ information bits, where $R_t$, $M_t$, t, and $L_t$ are integers greater than 0, t is greater than 1, and $M_t$ is less than $R_t$;

performing, by the transmitting device, polar encoding on the information to be transmitted for the $t^{th}$ time, to obtain a codeword after the Polar encoding;

obtaining, by the transmitting device, a codeword for $(t-1)^{th}$ retransmission based on the codeword after the Polar encoding; and transmitting, by the transmitting device, the codeword for $(t-1)^{th}$ retransmission.

In a possible design, before the obtaining, by a transmitting device, information to be transmitted for a $t^{th}$ time, the method further includes:

determining, by the transmitting device, that reliability of $K_t$ information locations in the R extension locations is higher than reliability of $K_t$ information bits with lowest reliability in the information to be transmitted for the $(t-1)^{th}$ time, where $M_t$ is equal to $K_t - L_t$.

In a possible design, $M_t$ and $L_t$ are positively correlated.

In a possible design, before the obtaining, by a transmitting device, information to be transmitted for a $t^{th}$ time, the method further includes:

determining, by the transmitting device, that the information to be transmitted for the $t^{th}$ time meets a preset condition, where the preset condition includes one or more of the following: a code length of the information to be transmitted for the $t^{th}$ time belongs to a first preset range, a code rate of the information to be transmitted for the $t^{th}$ time belongs to a second preset range, and a quantity of the information bits in the extension locations in the information to be transmitted for the $t^{th}$ time belongs to a third preset range.

In a possible design, the obtaining, by the transmitting device, a codeword for a $(t-1)^{th}$ retransmission based on the codeword after the Polar encoding includes:

performing, by the transmitting device, rate matching on the codeword after the Polar encoding based on a preset code length and a preset rate matching manner, to obtain a to-be-retransmitted sequence after the matching, where the preset rate matching manner is one or more of the following: puncturing rate matching, shortening rate matching, and repetition rate matching; and obtaining, by the transmitting device, the codeword for $(t-1)^{th}$ retransmission based on the to-be-retransmitted sequence after the matching.

In a possible design, when the preset rate matching manner is the puncturing rate matching, before the obtaining, by a transmitting device, information to be transmitted for a $t^{th}$ time, the method further includes:

determining, by the transmitting device, that the information to be transmitted for the $t^{th}$ time meets a preset condition, where the preset condition includes one or more of the following: a code length of the information to be transmitted for the $t^{th}$ time belongs to a first preset range, a code rate of the information to be transmitted for the $t^{th}$ time belongs to a second preset range, a quantity of the information bits in the extension locations in the information to be transmitted for the $t^{th}$ time belongs to a third preset range, and a quantity of puncturing bits in the codeword after the Polar encoding belongs to a fourth preset range.

According to a second aspect, this disclosure provides a data retransmission method. The method includes:

receiving, by a receiving device, a codeword for $(t-1)^{th}$ retransmission sent by a transmitting device, where the codeword for $(t-1)^{th}$ retransmission is a retransmission codeword obtained by the transmitting device based on a codeword after polar encoding that is obtained by information to be transmitted for a $t^{th}$ time, the information to be transmitted for the $t^{th}$ time includes $R_t$ extension locations and information to be transmitted for a $(t-1)^{th}$ time, and the extension locations include $M_t$ information bits and $L_t$ check bits corresponding to the $M_t$ information bits, where $R_t$, $M_t$, t, and $L_t$ are integers greater than 0, t is greater than 1, and $M_t$ is less than $R_t$; and performing, by the receiving device, Polar decoding on the codeword for $(t-1)^{th}$ retransmission, to obtain a decoding result of codewords for t times of transmission.

In a possible design, the performing, by the receiving device, Polar decoding on the codeword for $(t-1)^{th}$ retransmission, to obtain a decoding result of codewords for t times of transmission includes:

performing, by the receiving device, the Polar decoding on the codeword for (t−1) times of transmission, to obtain a decoding result of the codeword for $(t-1)^t$ retransmission;

performing, by the receiving device, check decoding on the decoding result of the codeword for $(t-1)^{th}$ retransmission, to obtain a check decoding result; and determining, by the receiving device, a reliable decoding path based on the check decoding result, and decoding, based on the reliable decoding path, codewords for first (t−1) times of transmission, to obtain the decoding result of the codewords for t times of transmission.

In a possible design, the determining, by the receiving device, a reliable decoding path based on the check decoding result, and decoding, based on the reliable decoding path, codewords for first (t−1) times of transmission includes:

determining, by the receiving device, a decoding path with highest reliability based on the check decoding result, and deleting another decoding path other than the decoding path with highest reliability; and decoding, based on the decoding path with highest reliability, the transmission codeword for the first $(t-1)^{th}$ time.

In a possible design, the reliability of $K_t$ information locations in the R extension locations is higher than the reliability of $K_t$ information locations with lowest reliability in the information to be transmitted for the $(t-1)^{th}$ time, where $M_t$ is equal to $K_t-L_t$.

In a possible design, $M_t$ and $L_t$ are positively correlated.

In a possible design, the information to be transmitted for the $t^{th}$ time meets a preset condition, where the preset condition includes one or more of the following: a code length of the information to be transmitted for the $t^{th}$ time belongs to a first preset range, a code rate of the information to be transmitted for the $t^{th}$ time belongs to a second preset range, and a quantity of the information bits in the extension locations in the information to be transmitted for the $t^{th}$ time belongs to a third preset range.

In a possible design, that the codeword for $(t-1)^{th}$ retransmission is a retransmission codeword obtained by the transmitting device based on a codeword after Polar encoding that is obtained by information to be transmitted for a $t^{th}$ time includes: the codeword for $(t-1)^{th}$ retransmission is obtained based on a to-be-retransmitted sequence that is after matching and that is obtained by a codeword on which rate matching is performed in a preset rate matching manner and that is obtained by performing Polar encoding on the information to be transmitted for the $t^{th}$ time, where the preset rate matching manner is one or more of the following: puncturing rate matching, shortening rate matching, and repetition rate matching.

In a possible design, when the preset rate matching manner is the puncturing rate matching, the information to be transmitted for the $t^{th}$ time meets a preset condition, and the preset condition includes one or more of the following: a code length of the information to be transmitted for the $t^{th}$ time belongs to a first preset range, a code rate of the information to be transmitted for the $t^{th}$ time belongs to a second preset range, a quantity of the information bits in the extension locations in the information to be transmitted for the $t^{th}$ time belongs to a third preset range, and a quantity of puncturing bits in the codeword after the Polar encoding belongs to a fourth preset range.

According to a third aspect, this disclosure provides a data retransmission apparatus. The apparatus includes a module or a means (means) configured to perform the method according to the first aspect and the implementations of the first aspect.

According to a fourth aspect, this disclosure provides a data retransmission apparatus. The apparatus includes a module or a means (means) configured to perform the method according to the second aspect and the implementations of the first aspect.

According to a fifth aspect, this disclosure provides a data retransmission apparatus. The apparatus includes a processor and a memory, where the memory is configured to store a program, and the processor invokes the program stored in the memory, to perform the method according to the first aspect of this disclosure.

According to a sixth aspect, this disclosure provides a data retransmission apparatus. The apparatus includes a processor and a memory, where the memory is configured to store a program, and the processor invokes the program stored in the memory, to perform the method according to the second aspect of this disclosure.

According to a seventh aspect, this disclosure provides a data retransmission apparatus. The apparatus includes at least one processing unit (or chip) configured to perform the method according to the first aspect.

According to an eighth aspect, this disclosure provides a data retransmission apparatus. The apparatus includes at least one processing unit (or chip) configured to perform the method according to the second aspect.

According to a ninth aspect, this disclosure provides a computer storage medium including a program, where the program is used to perform the method according to the first aspect.

According to a tenth aspect, this disclosure provides a computer storage medium including a program, where the program is used to perform the method according to the second aspect.

In the data retransmission method and apparatus provided in this disclosure, the transmitting device obtains the information to be transmitted for the $t^{th}$ time, where the information to be transmitted for the $t^{th}$ time includes $R_t$ extension locations and the information to be transmitted for the $(t-1)^{th}$ time, and the extension locations include $M_t$ information bits and $L_t$ check bits corresponding to the $M_t$ information bits. The transmitting device then performs Polar encoding on the information to be transmitted for the $t^{th}$ time, to obtain a codeword after the Polar encoding, obtains a codeword for $(t-1)^{th}$ retransmission based on the codeword after the Polar encoding, and transmits the codeword for $(t-1)^{th}$ retransmission. A receiving device performs Polar decoding after receiving the codeword for $(t-1)^{th}$ retransmission, to obtain a decoding result of codewords for t times of transmission. By performing, on an encoding side, check encoding on the information bits in an extension part, a decoding path can be reduced in a decoding process, thereby greatly reducing decoding complexity, and reducing storage overheads and calculation overheads.

DESCRIPTION OF EMBODIMENTS

Embodiments of this disclosure may be applied to a wireless communications system. It should be noted that the wireless communications system mentioned in the embodiments of this application includes but is not limited to: a narrowband internet of things system (NB-IoT), a global system for mobile communications (GSM), an enhanced data rates for GSM evolution system (EDGE), a wideband code division multiple access (WCDMA) system, a code division multiple access 2000 (CDMA2000) system, a time division-synchronous code division multiple access (TD-SCDMA) system, a long term evolution (LTE) system, and three major application scenarios of a next generation 5G mobile communications system, namely, enhanced mobile broadband (eMBB), URLLC, and massive machine-type communications (mMTC).

In the embodiments of this disclosure, a terminal device (terminal device) includes but is not limited to a mobile station (MS, Mobile Station), a mobile terminal (Mobile Terminal), a mobile telephone (Mobile Telephone), a handset (handset), a portable equipment (portable equipment), and the like. The terminal device may communicate with one or more core networks by using a radio access network (RAN, Radio Access Network). For example, the terminal device may be a mobile telephone (or referred to as a "cellular" telephone), or a computer having a communication function; or the terminal device may be a portable, pocket-sized, handheld, computer built-in, or in-vehicle mobile apparatus or device.

Figure 1A:
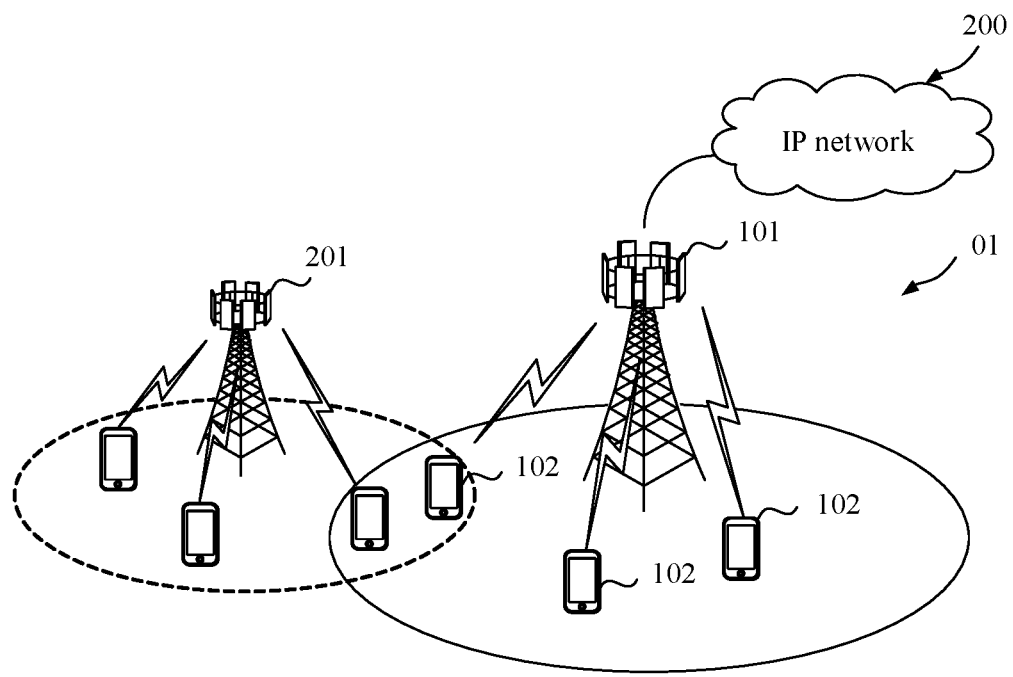
FIG. 1(a) is a schematic architectural diagram of a communications system according to the present disclosure.
Figure 1B:
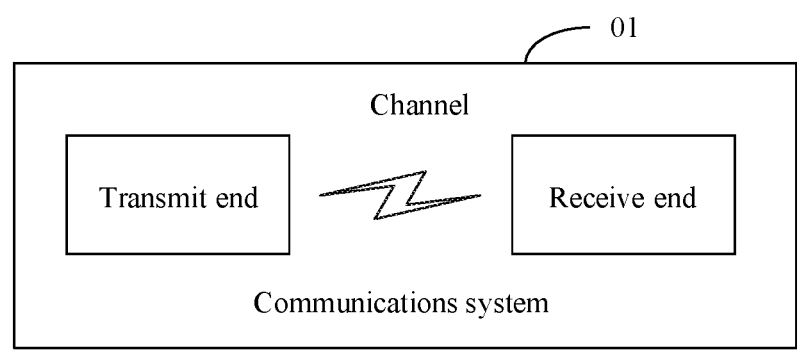
FIG. 1(b) is a schematic architectural diagram of a communications system according to the present disclosure.

FIG. 1(a) and FIG. 1(b) are schematic architectural diagrams of a communications system according to this disclosure.

As shown in FIG. 1(a), a communications system 01 includes a network device 101 and a terminal 102. When the wireless communications network 01 includes a core network, the network device 101 may be further connected to the core network. The network device 101 may further communicate with an internet protocol (Internet Protocol, IP) network 200, for example, an internet (internet), a private IP network, or another data network. A network device provides a service for a terminal within coverage of the network device. For example, referring to FIG. 1(a), the network device 101 provides wireless access for one or more terminals within coverage of the network device 101. In addition, there may be an overlapping area between coverage of network devices, for example, the network device 101 and a network device 201. The network devices may further communicate with each other. For example, the network device 101 may communicate with the network device 201.

When the network device 101 or the terminal 102 transmits information or data, a method described in the embodiments of this disclosure may be used. For ease of description, in the embodiments of this disclosure, the communications system 01 is simplified to a system that includes a transmitting device and a receiving device and that is shown in FIG. 1(b). The transmitting device may be the network device 101, and the receiving device is the terminal 102. Alternatively, the transmitting device is the terminal 102, and the receiving device is the network device 101.

The network device 101 may be a device configured to communicate with a terminal. For example, the network device 101 may be a base transceiver station (Base Transceiver Station, BTS) in a GSM system or a CDMA system, or may be a NodeB (NB) in a WCDMA system, or may be an evolved NodeB (eNB or eNodeB) in an LTE system or a network-side device in a future 5G network. Alternatively, the network device may be a relay station, an access point, a vehicle-mounted device, or the like. In a terminal-to-terminal (D2D) communications system, the network device may be a terminal that acts a function of a base station. The terminal may include various handheld devices, vehicle-mounted devices, wearable devices, or computing devices that have wireless communication functions, or another processing device connected to a wireless modem, and user equipment (UE), a mobile station (mobile station, MS), and the like in various forms.

The transmitting device is an encoding side, and may be configured to encode and output encoding information. The encoding information is transmitted to a decoding side on a channel. The receiving device is the decoding side, and may be configured to: receive the encoding information sent by the transmitting device, and decode the encoding information.

Figure 2:
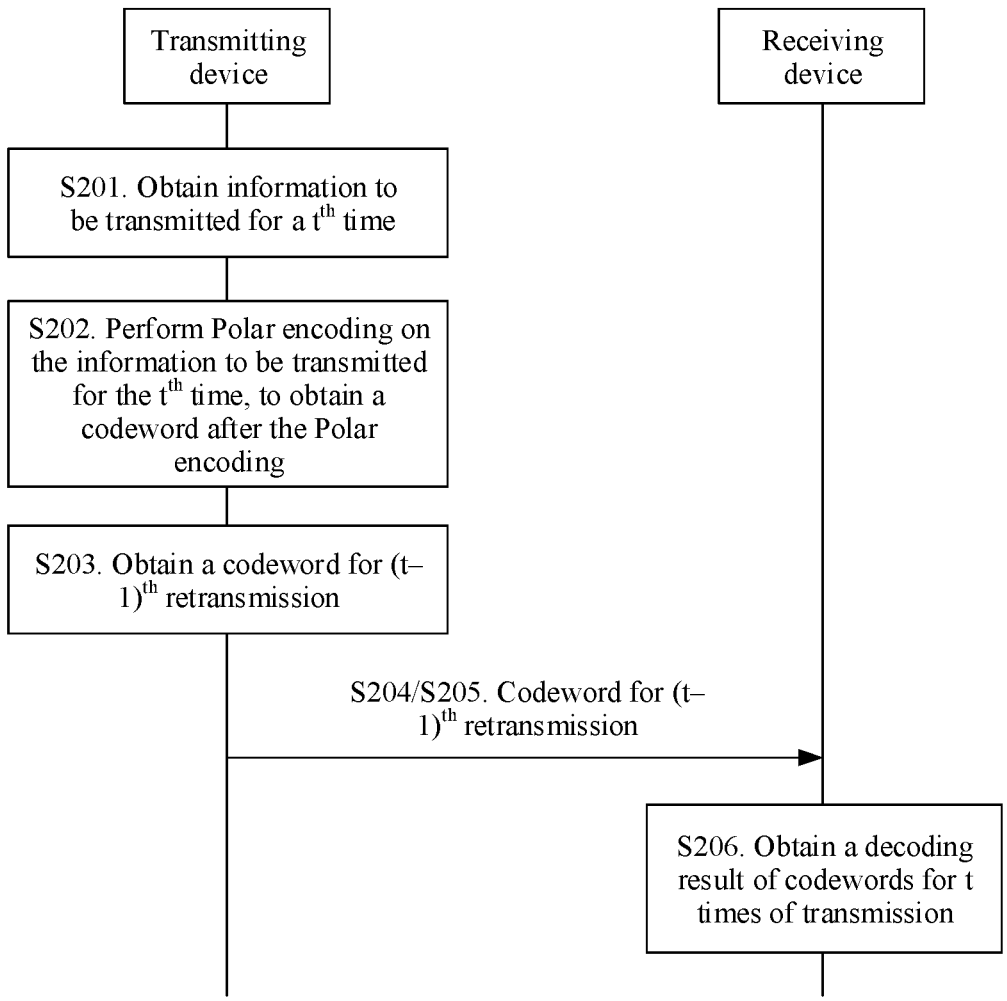
FIG. 2 is a schematic flowchart of a data retransmission method according to an embodiment of the present disclosure.

FIG. 2 is a schematic flowchart of a data retransmission method according to an embodiment of this disclosure. As shown in FIG. 2, the method includes the following blocks.

S201. A transmitting device obtains information to be transmitted for a $t^{th}$ time.

The information to be transmitted for the $t^{th}$ time includes $R_t$ extension locations and information to be transmitted for a $(t-1)^{th}$ time.

These extension locations include $M_t$ information bits and $L_t$ check bits corresponding to the $M_t$ information bits. $R_t$, $M_t$, t, and $L_t$ are integers greater than 0, t is greater than 1, and $M_t$ is less than $R_t$.

It should be noted that the information to be transmitted for the $t^{th}$ time is prepared for (t−1) times of retransmission. Optionally, after transmitting initially transmitted information or retransmitted information, the transmitting device waits for the receiving device to feed back an acknowledgment message. If the transmitting device receives a success acknowledgment message (for example, an ACK message) within a preset time period, it is considered that the receiving device successfully receives the initial transmission information or retransmission information, and retransmission is not performed again. If a reception failure message (for example, a NACK message) is received within a preset time period, or no feedback is received after the preset time period, it is considered that information transmission fails, and retransmission is prepared. Alternatively, the transmitting device obtains the information to be transmitted for the $t^{th}$ time after the preset time period without considering feedback, prepares for retransmission, and so on. This is not limited in this disclosure.

During initial transmission, the transmitting device performs check encoding on a to-be-transmitted information bit, generates a check bit, and forms a sequence of the check bit and the information bit; and then performs Polar encoding on the sequence, and transmits a codeword after the Polar encoding to the receiving device. Specifically, the check encoding is performed on the $K_1-L_1$ information bits, to obtain the check bit whose length is $L_1$, and form a sequence after the check encoding whose length is $K_1$. A reliability order of subchannels (each subchannel corresponds to one bit) is obtained based on a preset code length $P_1$ and a corresponding code rate $K/P_1$; and a subchannel sequence number set $I_1$ corresponding to the sequence after the check encoding whose length is $K_1$ (where a subchannel sequence number corresponding to the sequence after the check encoding whose length is $K_1$ used as an identifier of an information location), and a subchannel sequence number set $F_1$ corresponding to a frozen bit (where a subchannel sequence number corresponding to the frozen bit is used as an identifier of a frozen location) are obtained. The sequence after the check encoding whose length is $K_1$ mapped to the information location corresponding to $I_1$, the frozen bit is mapped to the frozen location corresponding to $F_1$, and then Polar encoding is performed on the whole for transmitting. $P_1$ is an integer greater than 0.

Each time retransmission is to be performed, previously information to be transmitted is extended based on a preset code length to form a new bit, and the new bit may be used to carry an information bit and a frozen bit that should be retransmitted. Optionally, the $M_t$ information bits are selected and placed in the information location in the extension locations.

In this disclosure, the check encoding is performed on the $M_t$ information bits in the extension locations to obtain $L_t$ check bits, and the $L_t$ check bits are also placed in the extension locations.

It should be noted that the check encoding in this disclosure may be performed in a plurality of manners (applicable to initial transmission and retransmission), for example, cyclic redundancy check (Cyclic Redundancy Check, CRC) encoding, parity check encoding, cyclic encoding, and Reed-Solomon (Reed-Solomon) encoding, Reed-Muller (Reed-Muller) encoding, Hamming encoding, and the like. These manners are not limited in this disclosure, and are mainly used to assist a decoding side in reducing decoding complexity.

The $M_t$ information bits, the $L_t$ check bits, and the information to be transmitted for the $(t-1)^{th}$ time in the extension locations form a long code, that is, form the information to be transmitted for the $t^{th}$ time. A construction principle of the information to be transmitted for the $(t-1)^{th}$ time is the same as a construction principle of the information to be transmitted for the $t^{th}$ time, and details are not described again.

S202. The transmitting device performs Polar encoding on the information to be transmitted for the $t^{th}$ time, to obtain a codeword after the Polar encoding.

S203. The transmitting device obtains a codeword for $(t-1)^{th}$ retransmission based on the codeword after the Polar encoding.

The foregoing used Polar encoding is to encode the entire long code including the $M_t$ information bits, the $L_t$ check bits, and the information to be transmitted for the $(t-1)^{th}$ time. After the codeword after the Polar encoding is obtained, a part of the codeword is extracted from the codeword and used as the codeword for $(t-1)^{th}$ retransmission.

S204. The transmitting device transmits the codeword for $(t-1)^{th}$ retransmission.

S205. The receiving device receives the codeword for the $(t-1)^{th}$ retransmission sent by the transmitting device.

S206. The receiving device performs Polar decoding on the codeword for $(t-1)^{th}$ retransmission, to obtain a decoding result of codewords for t times of transmission.

In this way, decoding can be completed, and information that the transmitting device wants to transmit can be obtained.

In a specific implementation process, the performing, by the receiving device, Polar decoding on the codeword for $(t-1)^{th}$ retransmission, to obtain a decoding result of codewords for t times of transmission may include: performing, by the receiving device, the Polar decoding on the codeword for $(t-1)^{th}$ retransmission, to obtain a decoding result of the codeword for $(t-1)^{th}$ retransmission; and performing check decoding on the decoding result of the codeword for $(t-1)^{th}$ retransmission, to obtain a check decoding result, determining a reliable decoding path based on the check decoding result, and decoding, based on the reliable decoding path, codewords for first (t−1) times of transmission, to obtain the decoding result of the codewords for t times of transmission.

Optionally, the receiving device may perform a Polar decoding operation by using CRC-aided successive cancellation list decoding (CA-SCL).

It should be noted that, after receiving the codeword for $(t-1)^{th}$ retransmission, the receiving device combines the codeword for $(t-1)^{th}$ retransmission and a received codeword for a first $(t-1)^{th}$ time to form a long code, and transmits the entire long code to a decoder for decoding.

In a specific implementation process, due to different rate matching and the like, when the codeword for $(t-1)^{th}$ retransmission is combined with the received codeword for the first $(t-1)^{th}$ time, cross combination may be performed, that is, a part of the received codeword for the first $(t-1)^{th}$ time is inserted into the retransmitted codeword. Therefore, in a process in which the receiving device performs the Polar decoding (CA-SCL decoding) on the codeword for $(t-1)^{th}$ retransmission, the receiving device also performs the Polar decoding on the part of the received codeword for the first $(t-1)^{th}$ time that is inserted into the retransmitted codeword, to obtain the decoding result of the codeword for $(t-1)^{th}$ retransmission.

When the transmitting device obtains the codeword for $(t-1)^{th}$ retransmission, the transmitting device may extract a codeword of a preset length as the codeword for $(t-1)^{th}$ retransmission.

It should be noted that, because the check encoding is also performed on the information bits in the extension locations, before the Polar encoding is performed on the information to be transmitted for the $t^{th}$ time, the check encoding is performed on all information bits carried in each part. After obtaining the decoding result of the codeword for $(t-1)^{th}$ retransmission, the decoding side performs the check decoding, and may determine the reliable decoding path based on the check decoding result.

In an optional manner, the transmitting device obtains the codeword for $(t-1)^{th}$ retransmission based on the codeword after the Polar encoding other than the codewords for first (t−1) times of transmission. In this way, the decoding side first obtains the decoding result of the codeword for $(t-1)^{th}$ retransmission by using the Polar decoding, so that the $M_t$ information bits in the extension locations and the $L_t$ check bits corresponding to the $M_t$ information bits can be obtained. Further, the check decoding is performed on the $M_t$ information bits and the $L_t$ check bits corresponding to the $M_t$ information bits, to obtain the check decoding result.

Figure 3:
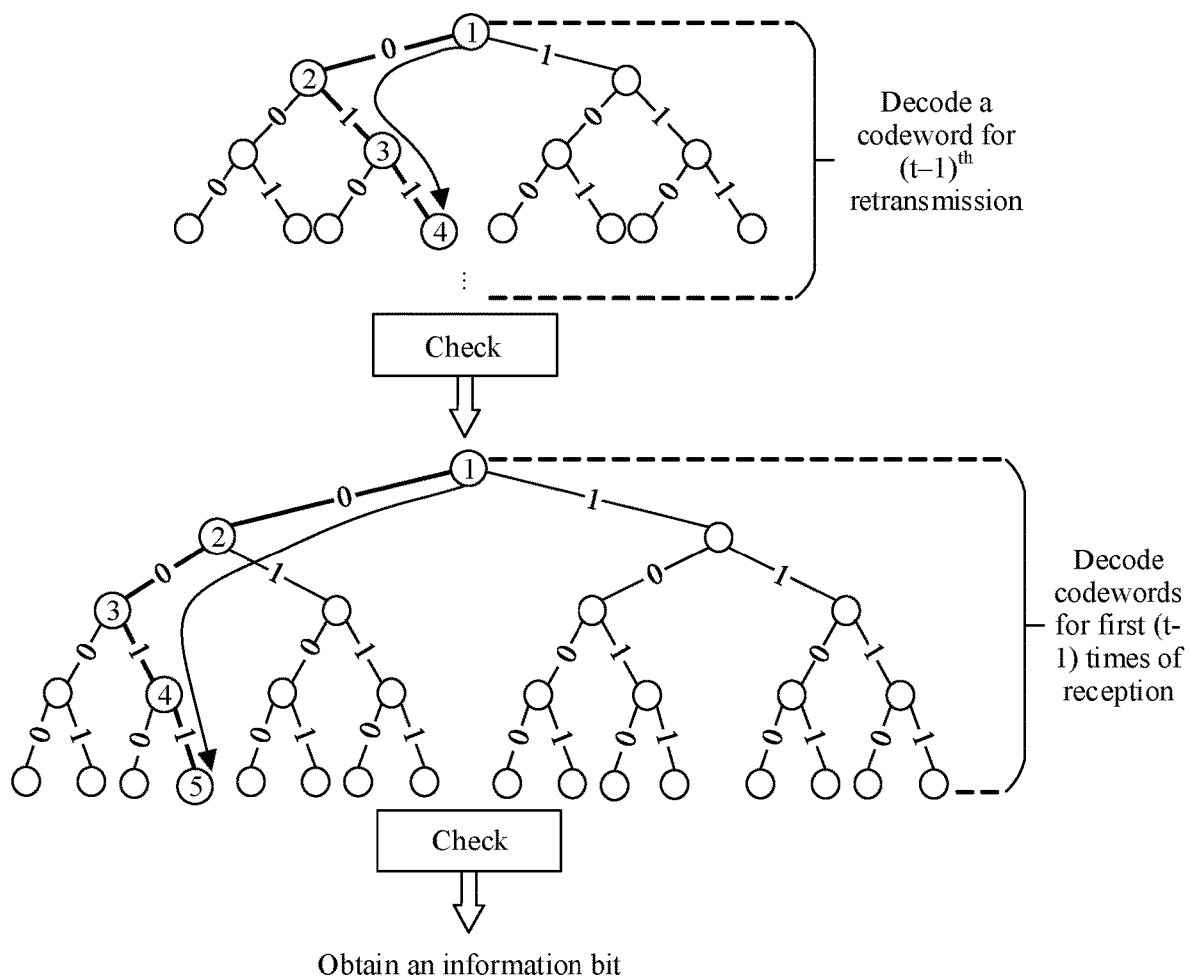
FIG. 3 is a schematic diagram of a decoding path according to an embodiment of the present disclosure.

FIG. 3 is a schematic diagram of a decoding path according to an embodiment of this disclosure.

Specifically, there are N paths in a check process. A path with highest reliability is determined based on a check decoding result, and then only the path with highest reliability is reserved.

To be specific, a receiving device performs check decoding on a decoding result of a codeword for $(t-1)^{th}$ retransmission, then determines, based on the check decoding result, a decoding path with highest reliability, and deletes another decoding path other than the decoding path with highest reliability, to further perform, based on the decoding path with highest reliability, decoding on codewords for first (t−1) times of transmission.

As shown in FIG. 3, after the check decoding is further performed on the decoding result of the codeword for $(t-1)^{th}$ retransmission, the decoding path with highest reliability (a path 1-2-3-4 shown by an arrow) is determined based on the check decoding result, and then decoding is further performed by using this path.

In a specific implementation process, the receiving device performs Polar decoding on a codeword received last time based on the decoding path with highest reliability; further performs check decoding on a result of the Polar decoding; and may further obtain the decoding path with highest reliability based on a check result, and reserve the decoding path with highest reliability. The rest can be deduced by analogy, until decoding of an initially transmitted codeword is completed. In this way, most reliable path decoding is used each time, thereby greatly reducing decoding complexity, and reducing storage overheads and calculation overheads.

In this embodiment, a transmitting device obtains information to be transmitted for a $t^{th}$ time, where the information to be transmitted for the $t^{th}$ time includes $R_t$ extension locations and information to be transmitted for a $(t-1)^{th}$ time, and the extension locations include M information bits and $L_t$ check bits corresponding to the $M_t$ information bits. The transmitting device then performs Polar encoding on the information to be transmitted for the $t^{th}$ time, to obtain a codeword after the Polar encoding, obtains a codeword for $(t-1)^{th}$ retransmission based on the codeword after the Polar encoding, and transmits the codeword for $(t-1)^{th}$ retransmission. The receiving device performs Polar decoding after receiving the codeword for $(t-1)^{th}$ retransmission, to obtain a decoding result of codewords for t times of transmission. By performing, on an encoding side, check encoding on the information bits in an extension part, a decoding path can be reduced in a decoding process, thereby greatly reducing decoding complexity, and reducing storage overheads and calculation overheads.

Optionally, the foregoing data retransmission method may be denoted as a transmission mode, and coexists with another transmission mode. After determining retransmission, the transmitting device selects a transmission mode for retransmission. Different transmission modes may be applicable to different scenarios or conditions.

Before obtaining the information to be transmitted for the $t^{th}$ time, the transmitting device determines that the information to be transmitted for the $t^{th}$ time meets a preset condition. When the preset condition is met, a transmission manner provided in this embodiment of this disclosure is used. Specifically, the preset condition includes one or more of the following: a code length of the information to be transmitted for the $t^{th}$ time belongs to a first preset range, a code rate of the information to be transmitted for the $t^{th}$ time belongs to a second preset range, and a quantity of the information bits in the extension locations in the information to be transmitted for the $t^{th}$ time belongs to a third preset range.

The transmission manner provided in this disclosure may be denoted as a "first transmission mode". Optionally, in some scenarios, in addition to the transmission manner provided in this embodiment of this disclosure, the first transmission mode may further include an extended incremental redundancy (IR) HARQ mode. In this extended IR HARQ mode, when the transmitting device performs retransmission, the information to be transmitted for the $t^{th}$ time further includes the extension locations, but the check encoding is not performed on the information bits in the extension locations, that is, there is no check bit, and $L_t$ is equal to 0. Further, the Polar encoding is performed on the information to be transmitted for the $t^{th}$ time, to obtain the codeword after the Polar encoding, and the codeword for $(t-1)^{th}$ retransmission is obtained and sent to the receiving device. The transmission manner or the extended IR HARQ mode provided in this embodiment of this disclosure may be determined based on different parameters such as the first preset range, the second preset range, and the third preset range.

The foregoing first transmission mode is selected when the preset condition is met.

Optionally, another transmission mode may alternatively include a Chase Combining (Chase Combining, CC) HARQ mode and an incremental redundancy (IR) HARQ mode. The transmission mode provided in this disclosure is denoted as the first transmission mode (a name is not limited). In the CC HARQ mode, the transmitting device transmits a same coded signal each time the transmitting device performs retransmission. The receiving device directly adds log-likelihood ratios (LLR) of all received signals, and then performs decoding. In the IR HARQ mode, the transmitting device does not introduce a new information location, but extends a code length and a kernel based on the information to be transmitted for the $(t-1)^{th}$ time. The extension locations carry a frozen bit, and a retransmitted codeword is transmitted after the Polar encoding. The IR HARQ mode is equivalent to retransmitting previously transmitted puncturing bits and some transmitted bits during retransmission.

Specifically, Thredhold_1 is a code rate threshold, Threshold_2 is a code length threshold, and Threshold_3 is a threshold of a quantity of the information bits. Optionally, Thredhold_1=⅛; Threshold_2=1024, 2048, or 4096; and Threshold_3=5. This is not limited and is determined based on a specific scenario.

When a long code (the information to be transmitted for the $t^{th}$ time) constructed during retransmission exceeds a limit of a system code rate and a code length, the CC HARQ mode is selected. For example, as a quantity of retransmission times increases, an overall code rate of a system is less than Thredhold_1 or a code length of the information to be transmitted for the $t^{th}$ time is greater than Threshold_2. In this case, the system does not support the code length or code construction at the code rate, and cannot perform the first transmission mode. Therefore, the CC HARQ mode is selected.

When the quantity of the information bits in the extension locations is relatively small, the IR HARQ mode is selected. For example, when the quantity of information bits in the extension locations is smaller than Threshold_3 during retransmission, performance gain brought by introducing the information bits is less than or equal to performance loss brought by performing the check encoding on the new information bits. Therefore, in this case, it is selected not to introduce the information bits, instead, the code length and the kernel are extended based on the information to be transmitted for the $(t-1)^{th}$ time, and then extended bits are transmitted, that is, the IR HARQ mode is used for transmission.

It can be learned that the first preset range is greater than or equal to Threshold_1, the second preset range is less than or equal to Threshold_2, and the third preset range is greater than or equal to Threshold_3.

Herein, the foregoing preset condition is not limited, and conditions for selecting the modes may be determined based on different scenario requirements. This is not limited to the foregoing several modes, and another transmission mode may alternatively coexist.

Based on the foregoing embodiment, the transmitting device further performs rate matching after performing the Polar encoding.

Optionally, the obtaining, by the foregoing transmitting device obtains a codeword for $t^{th}$ retransmission based on the codeword after the Polar encoding may include: performing, by the transmitting device based on a preset code length and a preset rate matching manner, rate matching on the codeword after the Polar encoding, to obtain a retransmission sequence after the matching. The transmitting device obtains the codeword for $(t-1)^{th}$ retransmission based on the retransmission sequence after the matching.

The preset rate matching manner is one or more of the following: puncturing rate matching, shortening rate matching, and repetition rate matching.

It should be noted that the preset code length is a code length of the information to be transmitted for the $t^{th}$ time. The code length of the information to be transmitted for the $t^{th}$ time may be preconfigured, and a rate matching manner is selected based on the codeword after Polar encoding, to perform the rate matching. The retransmission sequence after the matching is obtained, and then the retransmitted codeword for the $(t-1)^{th}$ time is selected from the retransmission sequence after the matching.

In another optional implementation, when the preset rate matching manner selects the puncturing rate matching, before obtaining the information to be transmitted for the $t^{th}$ time, the transmitting device determines that the information to be transmitted for the $t^{th}$ time meets the preset condition. The preset condition herein includes one or more of the following: a code length of the information to be transmitted for the $t^{th}$ time belongs to a first preset range, a code rate of the information to be transmitted for the $t^{th}$ time belongs to a second preset range, a quantity of the information bits in the extension locations in the information to be transmitted for the $t^{th}$ time belongs to a third preset range, and a quantity of puncturing bits in the foregoing codeword after the Polar encoding belongs to a fourth preset range. The foregoing first transmission mode is selected when the foregoing preset condition is met.

The puncturing bits in the codeword after the Polar encoding may be understood as redundant bits in the codeword after the Polar encoding that are determined based on the preset code length.

Threshold_4 is a threshold of the quantity of the puncturing bits. Optionally, Threshold_4=(¾)*$N_{t-1}$, where $N_{t-1}$ indicates a mother code length during transmission for a $(t-1)^{th}$ time (that is, last transmission). A mother code herein is a codeword after Polar encoding and before rate matching, that is, the foregoing codeword after the Polar encoding. In addition, the mother code length is an integral power of 2, and is greater than or equal to a length of the information to be transmitted for the $(t-1)^{th}$ time.

When a long code (the information to be transmitted for the $t^{th}$ time) constructed during retransmission exceeds a limit of a system code rate and a code length, the CC HARQ mode is selected. For example, as a quantity of retransmission times increases, an overall code rate of a system is less than Thredhold_1 or a code length of the information to be transmitted for the $t^{th}$ time is greater than Threshold_2. In this case, the system does not support the code length or code construction at the code rate, and cannot perform the first transmission mode. Therefore, the CC HARQ mode is selected.

When the quantity of the information bits in the extension locations is relatively small or a quantity of puncturing bits in the codeword after the Polar encoding is relatively large, the IR HARQ mode is selected. For example, when the quantity of information bits in the extension locations is smaller than Threshold_3 during retransmission, performance gain brought by introducing the information bits is less than or equal to performance loss brought by performing the check encoding on the new information bits. Therefore, in this case, it is selected not to introduce the information bits, instead, the code length and the kernel are extended based on the information to be transmitted for the $(t-1)^{th}$ time, and then extended bits are transmitted, that is, the IR HARQ mode is used for transmission. When a quantity of puncturing bits in a codeword obtained after Polar encoding for a $(t-1)^{th}$ time is greater than Threshold_4, the IR HARQ mode is also selected for transmission. This may bring a relatively large performance gain.

It can be learned that the first preset range is greater than or equal to Threshold_1, the second preset range is less than or equal to Threshold_2, the third preset range is greater than or equal to Threshold_3, and the fourth preset range is less than or equal to Threshold_4.

Figure 4:
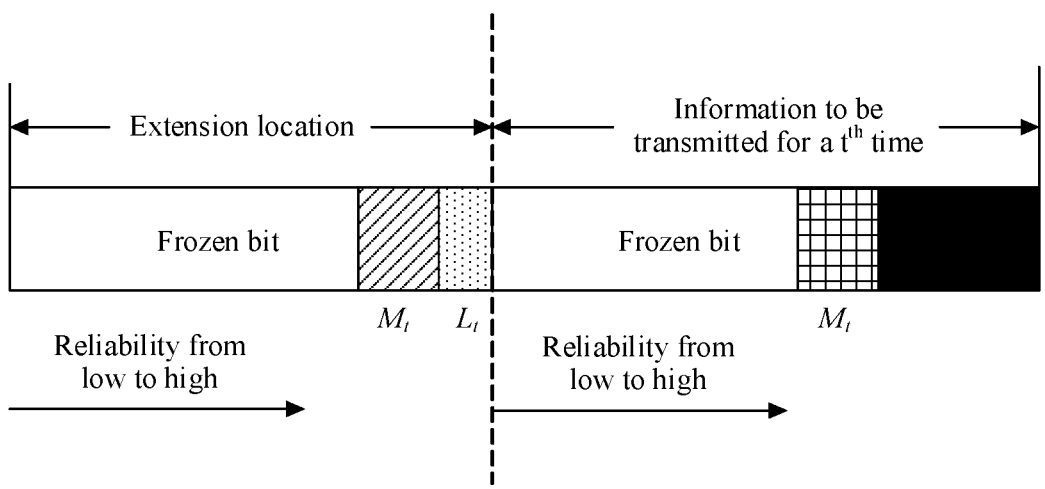
FIG. 4 is a schematic structural diagram of information to be transmitted for a $t^{th}$ time according to an embodiment of the present disclosure.

FIG. 4 is a schematic structural diagram of information to be transmitted for a $t^{th}$ time according to an embodiment of this disclosure.

Optionally, based on the foregoing embodiment, before the transmitting device obtains the information to be transmitted for a $t^{th}$ time, the transmitting device determines whether reliability of $K_t$ information locations in R extension locations is higher than reliability of $K_t$ information locations with lowest reliability in information to be transmitted for a $(t-1)^{th}$ time before the transmitting device obtains the information to be transmitted for a $t^{th}$ time, where $M_t$ is equal to $K_t$-$L_t$.

To be specific, when constructing the information to be transmitted for the $t^{th}$ time, the transmitting device should determine whether the reliability of the $K_t$ information locations in the R extension locations is higher than the reliability of the $K_t$ information locations with lowest reliability in the information to be transmitted for the $(t-1)^{th}$ time. As shown in FIG. 4, if there is the reliability of the $K_t$ information locations in the R extension locations higher than the reliability of the $K_t$ information locations with lowest reliability in the information to be transmitted for the $(t-1)^{th}$ time, the information bits with lowest reliability in the information to be transmitted for the $(t-1)^{th}$ time are copied to the extension locations, and $L_t$ check bits are obtained by check encoding and are also placed in the extension locations. The $M_t$ information bits may be the $M_t$ information bits with lowest reliability in the information to be transmitted for the $(t-1)^{th}$ time.

It should be noted that FIG. 4 is merely an example. During specific implementation, reliability of locations in which the $L_t$ check bits are located may be higher than reliability of locations in which the information bits are located. The $L_t$ check bits may alternatively be crossed with the $M_t$ information bits, that is, one or more information bits are adjacent to one or more check bits. This is not limited to FIG. 4.

Optionally, after the $M_t$ information bits with lowest reliability in the information to be transmitted for the $(t-1)^{th}$ time are copied to the extension locations, the original information locations with lowest reliability that is in the information to be transmitted for the $(t-1)^{th}$ time and that are included in the information to be transmitted for the $t^{th}$ time become frozen bits.

On the other hand, if reliability of the R extension locations is lower than reliability of the information locations (locations carrying information bits) in the information to be transmitted for the $(t-1)^{th}$ time, the information bits are not copied to the extension locations, instead, Polar encoding is performed on the information to be transmitted for the $(t-1)^{th}$ time, and information after the Polar encoding is sent to the receiving device. Correspondingly, after obtaining a decoding result of a codeword for $(t-1)^{th}$ retransmission, the receiving device may further determine whether the $K_t$ information locations with highest reliability are in the decoding result of the codeword for $(t-1)^{th}$ retransmission, and if the information locations with highest reliability exist in the decoding result of the codeword for $(t-1)^{th}$ retransmission, continue to perform check decoding on the decoding result of the codeword for $(t-1)^{th}$ retransmission. Otherwise, it is considered that the decoding result of the codeword for $(t-1)^{th}$ retransmission is the known frozen bits.

It should be noted that the foregoing implementation is not limited. In some scenarios, reliability of some bits in the extension locations is lower than reliability of the $K_t$ information locations with lowest reliability in the information to be transmitted for the $(t-1)^{th}$ time, and the extension locations may alternatively be used to carry information.

In other words, it may be determined that the $M_t$ information locations carry the $M_t$ information bits in the extension locations, where $M_t$ may not be equal to $K_t$-$L_t$.

The foregoing $M_t$ and $L_t$ may be correlated. Optionally, the foregoing $M_t$ and $L_t$ may be positively correlated, that is, more information bits in the extension locations indicate more check bits required, so that a sufficient check capability is provided, and an excessively higher probability of missing detection and incorrect detection is avoided.

In a specific implementation process, $L_t$ may alternatively be determined based on a specific requirement. For example, in the information to be transmitted for the $t^{th}$ time, $L_t$ may alternatively be determined based on the following formula:

$$L_t = \begin{cases} 3, 5 < K_t \le 10 \\ 4, 10 < K_t \le 20 \\ 5, 20 < K_t \le 50 \\ 6, 50 < K_t \le 150 \\ 8, K_t > 150 \end{cases}.$$

Certainly, the foregoing examples are not used as a limitation. $L_t$, $M_t$, and $K_t$ may all be preset fixed values. This is not limited in this disclosure.

Optionally, in some scenarios, $L_t$ may alternatively be 0.

Figure 5:
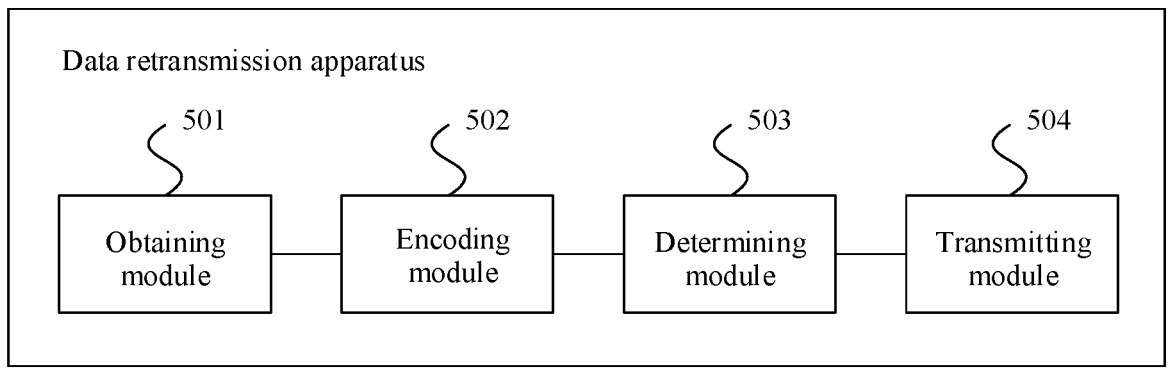
FIG. 5 is a schematic structural diagram of a data retransmission apparatus according to an embodiment of the present disclosure.

FIG. 5 is a schematic structural diagram of a data retransmission apparatus according to an embodiment of this disclosure. The apparatus may be the foregoing transmitting device. As shown in FIG. 5, the apparatus includes an obtaining module 501, an encoding module 502, a determining module 503, and a transmitting module 504, where the obtaining module 501 is configured to obtain information to be transmitted for a $t^{th}$ time, where information to be transmitted for a $t^{th}$ time includes $R_t$ extension locations and information to be transmitted for a $(t-1)^{th}$ time, and the extension locations include $M_t$ information bits and $L_t$ check bits corresponding to the $M_t$ information bits, where $R_t$, $M_t$, and $L_t$ are integers greater than 0, t is greater than 1, and $M_t$ is less than $R_t$;

the encoding module 502 is configured to perform polar encoding on the information to be transmitted for the $t^{th}$ time, to obtain a codeword after the Polar encoding;

the determining module 503 is configured to obtain a codeword for $(t-1)^{th}$ retransmission based on the codeword after the Polar encoding; and the transmitting module 504 is configured to transmit the codeword for $(t-1)^{th}$ retransmission.

Figure 6:
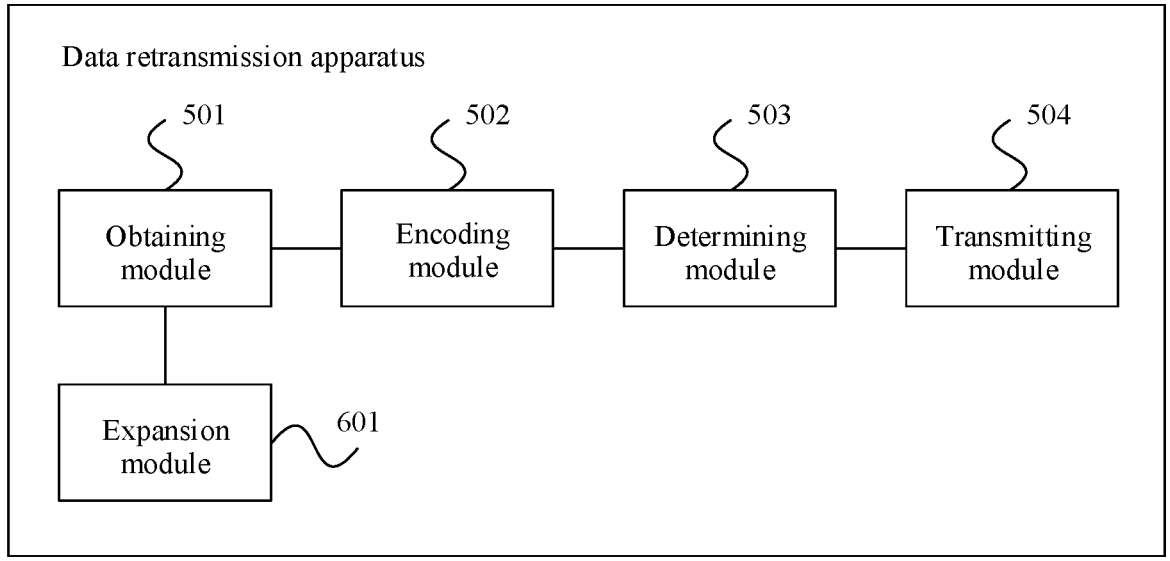
FIG. 6 is a schematic structural diagram of a data retransmission apparatus according to another embodiment of the present disclosure.

FIG. 6 is a schematic structural diagram of a data retransmission apparatus according to still another embodiment of this disclosure. As shown in FIG. 6, based on FIG. 5, the apparatus may further include an extension module 601, configured to: determine that reliability of $K_t$ information locations in the R extension bits is higher than reliability of $K_t$ information locations with lowest reliability in the information to be transmitted for the $(t-1)^{th}$ time before the obtaining module 501 obtains the information to be transmitted for the $t^{th}$ time, where $M_t$ is equal to $K_t-L_t$.

Optionally, $M_t$ and $L_t$ are positively correlated.

Figure 7:
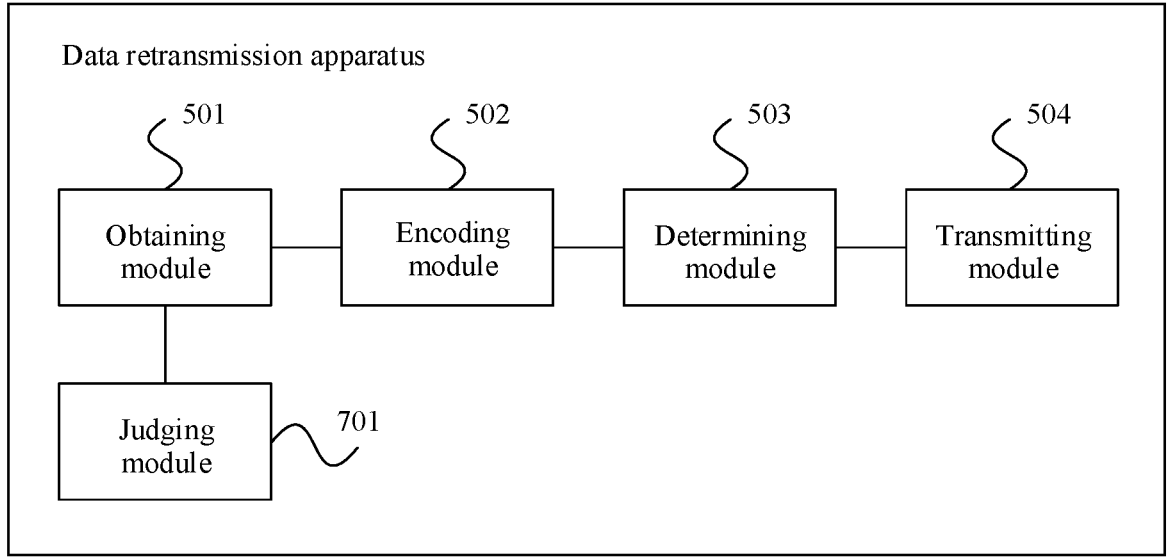
FIG. 7 is a schematic structural diagram of a data retransmission apparatus according to still another embodiment of the present disclosure.

FIG. 7 is a schematic structural diagram of a data retransmission apparatus according to still another embodiment of this disclosure. As shown in FIG. 6, based on FIG. 5, the apparatus may further include a determining module 701.

In an implementation, the determining module 701 is configured to determine that the information to be transmitted for the $t^{th}$ time meets a preset condition before the obtaining module 501 obtains the information to be transmitted for the $t^{th}$ time, where the preset condition includes one or more of the following: a code length of the information to be transmitted for the $t^{th}$ time belongs to a first preset range, a code rate of the information to be transmitted for the $t^{th}$ time belongs to a second preset range, and a quantity of the information bits in the extension locations in the information to be transmitted for the $t^{th}$ time belongs to a third preset range.

Optionally, in another implementation, the determining module 503 is specifically configured to: perform rate matching on the codeword after the Polar encoding based on a preset code length and a preset rate matching manner, to obtain a to-be-retransmitted sequence after the matching, where the preset rate matching manner is one or more of the following: puncturing rate matching, shortening rate matching, and repetition rate matching; and obtain the codeword for $(t-1)^{th}$ retransmission based on the to-be-retransmitted sequence after the matching.

When the preset rate matching manner is the puncturing rate matching, the determining module 701 is configured to determine that the information to be transmitted for the $t^{th}$ time meets a preset condition before the obtaining module obtains the information to be transmitted for the $t^{th}$ time, where the preset condition includes one or more of the following: a code length of the information to be transmitted for the $t^{th}$ time belongs to a first preset range, a code rate of the information to be transmitted for the $t^{th}$ time belongs to a second preset range, a quantity of the information bits in the extension locations in the information to be transmitted for the $t^{th}$ time belongs to a third preset range, and a quantity of puncturing bits in the codeword after the Polar encoding belongs to a fourth preset range.

Figure 8:
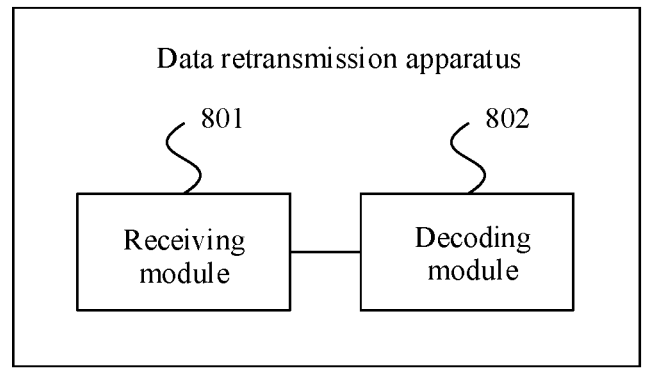
FIG. 8 is a schematic structural diagram of a data retransmission apparatus according to still another embodiment of the present disclosure.

FIG. 8 is a schematic structural diagram of a data retransmission apparatus according to still another embodiment of this disclosure. The apparatus may be the foregoing receiving device. As shown in FIG. 8, the apparatus includes a receiving module 801 and a decoding module 802, where the receiving module 801 is configured to receive a codeword for $(t-1)^{th}$ retransmission sent by a transmitting device, where the codeword for $(t-1)^{th}$ retransmission is a retransmitted codeword obtained by the transmitting device based on a codeword after polar encoding that is obtained by information to be transmitted for a $t^{th}$ time, the information to be transmitted for the $t^{th}$ time includes $R_t$ extension locations and information to be transmitted for a $(t-1)^{th}$ time, and the extension locations include $M_t$ information bits and $L_t$ check bits corresponding to the $M_t$ information bits, where $R_t$, $M_t$, t, and $L_t$ are integers greater than 0, t is greater than 1, and $M_t$ is less than $R_t$; and a decoding module 802 is configured to perform Polar decoding on the codeword for $(t-1)^{th}$ retransmission, to obtain a decoding result of codewords for t times of transmission.

Optionally, the decoding module 802 is specifically configured to: perform the Polar decoding on the codeword for $(t-1)^{th}$ retransmission, to obtain a decoding result of the codeword for $(t-1)^{th}$ retransmission; perform check decoding on the decoding result of the codeword for $(t-1)^{th}$ retransmission, to obtain a check decoding result; and determine a reliable decoding path based on the check decoding result, and decode, based on the reliable decoding path, codewords for first (t-1) times of transmission, to obtain the decoding result of the codewords for t times of transmission.

For determining the reliable decoding path based on the check decoding result, decoding, based on the reliable decoding path, the codeword for (t-1) times of transmission, and obtaining the decoding result of the codewords for t times of transmission, the decoding module 802 is specifically configured to: determine a decoding path with highest reliability based on the check decoding result, and delete another decoding path other than the decoding path with the highest reliability; and decode, based on the decoding path with the highest reliability, the codeword for first (t-1) times of transmission.

Further, the reliability of $K_t$ information locations in the R extension locations is higher than the reliability of $K_t$ information locations with lowest reliability in the information to be transmitted for the $(t-1)^{th}$ time, where $M_t$ is equal to $K_t-L_t$.

Optionally, $M_t$ and $L_t$ are positively correlated.

Optionally, the information to be transmitted for the $t^{th}$ time meets a preset condition, where the preset condition includes one or more of the following: a code length of the information to be transmitted for the $t^{th}$ time belongs to a first preset range, a code rate of the information to be transmitted for the $t^{th}$ time belongs to a second preset range, and a quantity of the information bits in the extension locations in the information to be transmitted for the $t^{th}$ time belongs to a third preset range.

Optionally, that the codeword for $(t-1)^{th}$ retransmission is a retransmitted codeword obtained by the transmitting device based on a codeword after Polar encoding that is obtained by information to be transmitted for a $t^{th}$ time includes: the codeword for $(t-1)^{th}$ retransmission is obtained based on a to-be-retransmitted sequence that is after matching and that is obtained by a codeword on which rate matching is performed in a preset rate matching manner and that is obtained by performing Polar encoding on the information to be transmitted for the $t^{th}$ time, where the preset rate matching manner is one or more of the following: puncturing rate matching, shortening rate matching, and repetition rate matching.

Correspondingly, when the preset rate matching manner is the puncturing rate matching, the information to be transmitted for the $t^{th}$ time meets a preset condition, where the preset condition includes one or more of the following: a code length of the information to be transmitted for the $t^{th}$ time belongs to a first preset range, a code rate of the information to be transmitted for the $t^{th}$ time belongs to a second preset range, a quantity of the information bits in the extension locations in the information to be transmitted for the $t^{th}$ time belongs to a third preset range, and a quantity of puncturing bits in the codeword after the Polar encoding belongs to a fourth preset range.

The foregoing apparatus may be configured to perform the methods provided in the foregoing method embodiments. Specific implementations and technical effects are similar, and details are not described herein again.

It should be noted and understood that division into the modules of the foregoing apparatus is merely logical function division. During actual implementation, some or all modules may be integrated into one physical entity, or the modules may be physically separated. In addition, these modules may be all implemented in a form of software invoked by a processing element, or may be all implemented in a form of hardware; or some modules may be implemented in a form of software invoked by a processing element, and some modules are implemented in a form of hardware. For example, a determining module may be a processing element separately disposed, or may be integrated in a chip of the foregoing apparatus for implementation. In addition, the determining module may be stored in a memory of the foregoing apparatus in a form of program code, and is invoked by a processing element of the foregoing apparatus to perform a function of the foregoing determining module. Implementations of other modules are similar thereto. In addition, all or some of the modules may be integrated together, or may be implemented separately. The processing element herein may be an integrated circuit and has a signal processing capability. In an implementation process, blocks in the foregoing methods or the foregoing modules can be implemented by using a hardware integrated logical circuit in the processing element, or by using instructions in a form of software.

For example, the foregoing modules may be configured as one or more integrated circuits implementing the foregoing methods, for example, one or more application-specific integrated circuits (ASIC), one or more microprocessors (DSP), or one or more field programmable gate arrays (FPGA). For another example, when a module is implemented in a form of program code invoked by a processing element, the processing element may be a general-purpose processor, for example, a central processing unit (CPU) or another processor that can invoke the program code. For another example, the modules may be integrated together, and implemented in a form of a system-on-a-chip (SOC).

Figure 9:
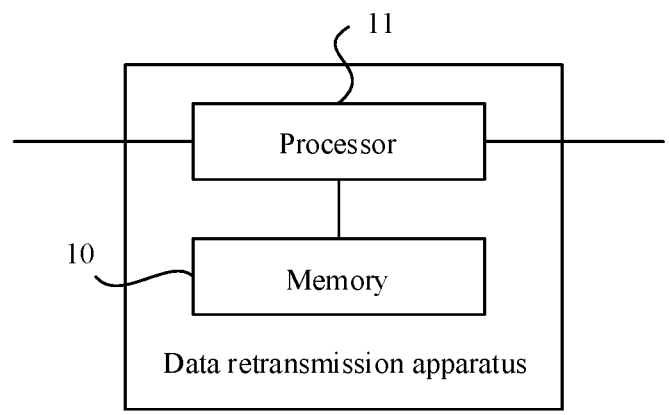
FIG. 9 is a schematic structural diagram of a data retransmission apparatus according to still another embodiment of the present disclosure.

FIG. 9 is a schematic structural diagram of a data retransmission apparatus according to still another embodiment of this disclosure. The apparatus may be integrated into the foregoing transmitting device. As shown in FIG. 9, the apparatus includes a memory 10 and a processor 11.

The memory 10 may be an independent physical unit, and may be connected to the processor 11 by using a bus. Alternatively, the memory 10 and the processor 11 may be integrated together, and implemented by using hardware, or the like.

The memory 10 is configured to store a program for implementing the foregoing methods embodiment or the modules in the embodiments shown in FIG. 5 to FIG. 7. The processor 11 invokes the program to perform an operation of the foregoing method embodiments.

Figure 10:
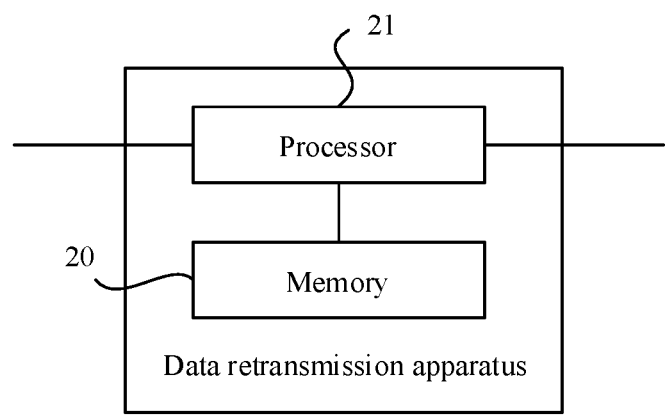
FIG. 10 is a schematic structural diagram of a data retransmission apparatus according to still another embodiment of the present disclosure.

FIG. 10 is a schematic structural diagram of a data retransmission apparatus according to still another embodiment of this disclosure. The apparatus may be integrated into the foregoing receiving device. As shown in FIG. 10, the apparatus includes a memory 20 and a processor 21. The memory 20 may be an independent physical unit, and may be connected to the processor 21 by using a bus. Alternatively, the memory 20 and the processor 21 may be integrated together, and implemented by using hardware or some software.

The memory 20 is configured to store a program for implementing the foregoing method embodiments or the modules in the embodiment shown in FIG. 8. The processor 21 invokes the program to perform an operation of the foregoing method embodiments.

Optionally, when some or all of the data retransmission methods in the foregoing embodiments are implemented by using software, the data retransmission apparatus may alternatively include only a processor. The memory configured to store the program is located outside the data retransmission apparatus. The processor is connected to the memory by using a circuit/wire, and is configured to read and execute the program stored in the memory.

The processor may be a central processing unit (central processing unit, CPU), a network processor (network processor, NP), or a combination of a CPU and an NP.

The processor may further include a hardware chip. The foregoing hardware chip may be an application-specific integrated circuit (ASIC), a programmable logic device (PLD), or a combination thereof. The foregoing PLD may be a complex programmable logic device (CPLD), a field-programmable logic gate array (FPGA), a generic array logic (GAL), or any combination thereof.

The memory may include a volatile memory, for example, a random access memory (RAM); or the memory may include a nonvolatile memory, for example, a flash memory, a hard disk drive (HDD), or a solid-state drive (SSD); or the memory may include a combination of the foregoing types of memories.

Figure 11:
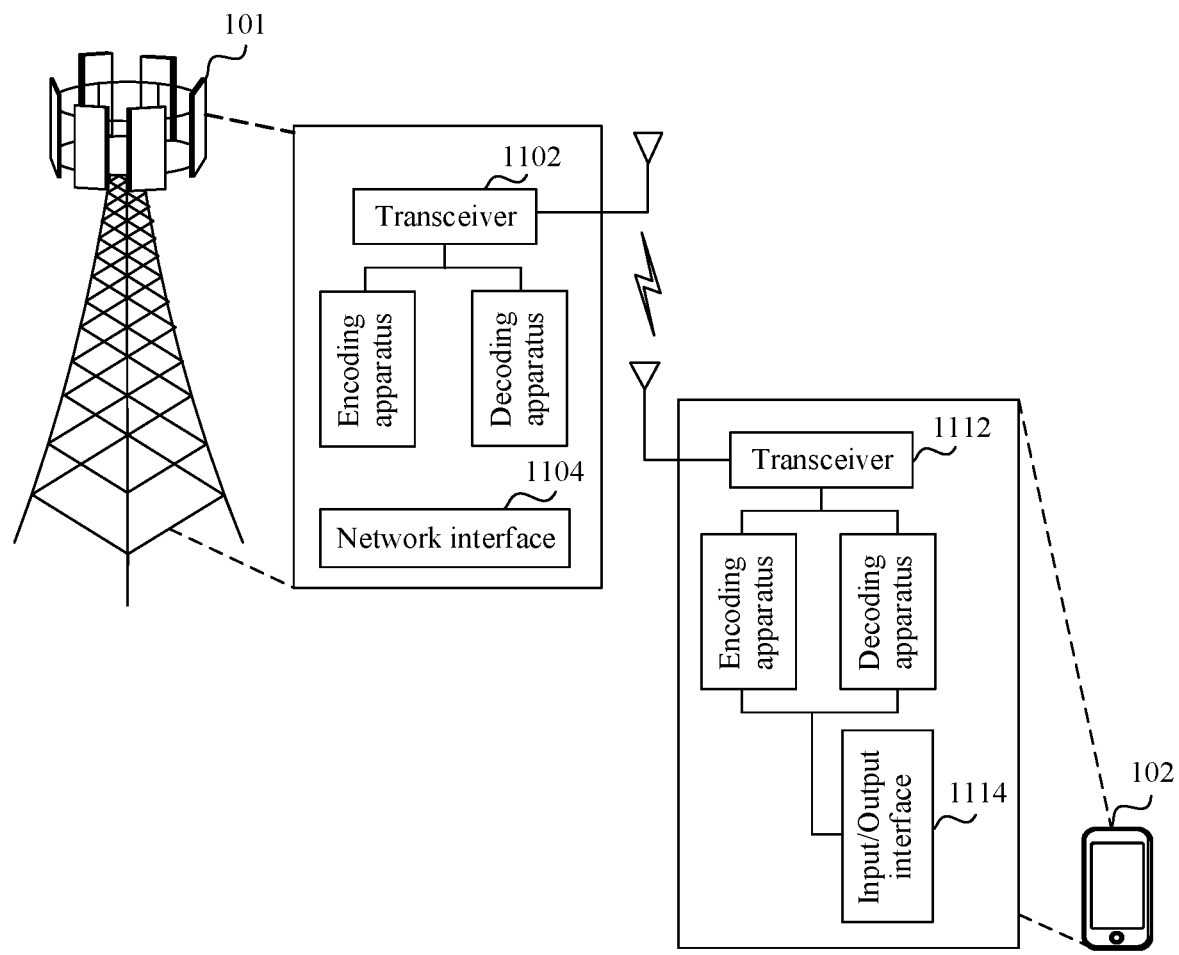
FIG. 11 is a schematic interaction diagram of a communications system according to an embodiment of the present disclosure.

FIG. 11 is a schematic interaction diagram of a communications system according to an embodiment of this disclosure. As shown in FIG. 11, the system includes a network device 101 and a terminal 102.

Referring to FIG. 11, an encoding apparatus and a decoding apparatus may be installed in the network device 101. Both the encoding apparatus and the decoding apparatus may be the foregoing data retransmission apparatus. The data retransmission apparatus may alternatively be the encoding apparatus when serving as a transmitting device, and the data retransmission apparatus may alternatively be the decoding apparatus when serving as a receiving device. In addition to the foregoing encoding apparatus and decoding apparatus, the network device 101 may further include a transceiver 1102. A sequence obtained after encoding by the encoding apparatus may be sent to the terminal 102 by using the transceiver 1102, or the transceiver 1102 is further configured to receive information/data from the terminal 102. The information/data is converted into a to-be-decoded sequence after a series of processing, and a decoding result is obtained after processing by the decoding apparatus.

As shown in FIG. 11, the network device 101 may further include a network interface 1104, configured to communicate with another network device.

Similarly, the foregoing encoding apparatus and the decoding apparatus may be further installed in the terminal 102. In addition to the foregoing encoding apparatus and decoding apparatus, the terminal 102 may further include a transceiver 1112. After being subsequently changed or processed, a sequence obtained after encoding by the encoding apparatus is sent to the network device 101 by using the transceiver 1112, or the transceiver 1112 is further configured to receive information/data from the network device 101. The information/data is converted into a to-be-decoded sequence after a series of processing, and a decoding result is obtained after processing by the decoding apparatus. The terminal 102 may further include an input/output interface 1114, configured to receive information entered by a user. Information that should be sent to the network device 101 should be processed by the encoding apparatus and then sent to the network device 101 by using the transceiver 1112. The decoding result obtained by the decoding apparatus may alternatively be presented to the user by using the input/output interface 1114 after subsequent processing.

An embodiment of this disclosure further provides a computer storage medium storing a computer program, and the computer program is used to perform the data retransmission methods provided in the foregoing embodiments.

An embodiment of this disclosure further provides a computer program product including an instruction, and when the instruction is run on a computer, the computer is enabled to perform the data retransmission methods provided in the foregoing embodiments.

A person skilled in the art should understand that the embodiments of this disclosure may be provided as a method, a system, or a computer program product. Therefore, this disclosure may use a form of hardware only embodiments, software only embodiments, or embodiments with a combination of software and hardware. Moreover, this disclosure may use a form of a computer program product that is implemented on one or more computer-usable storage media (including but not limited to a disk memory, a CD-ROM, an optical memory, and the like) that include computer usable program code.

This disclosure is described with reference to the flowcharts and/or block diagrams of the methods, the device (system), and the computer program product according to the embodiments of this disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a special-purpose computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and blocks are performed on the computer or the another programmable device, thereby generating computer-implemented processing. Therefore, the instructions executed on the computer or the another programmable device provide methods, actions, operations, etc., for implementing a specific function in one or more processes in the flowcharts and/or in one or more blocks in the block diagrams.

What is claimed is:

1. A data retransmission method, comprising:
obtaining, by a transmitting device, information to be transmitted for a $t^{th}$ time, wherein the information to be transmitted for the $t^{th}$ time comprises $R_t$ extension locations and information to be retransmitted for a $(t-1)^{th}$ time, and the extension locations comprise $M_t$ information bits and $L_t$ check bits corresponding to the $M_t$ information bits, wherein $R_t$, $M_t$, and $L_t$ are integers greater than 0, t is greater than 1, and $M_t$ is less than $R_t$;
performing, by the transmitting device, polar encoding on the information to be transmitted for the $t^{th}$ time, to obtain a codeword after the polar encoding;
obtaining, by the transmitting device, a codeword for $(t-1)^{th}$ retransmission based on the codeword after the polar encoding; and
transmitting, by the transmitting device, the codeword for $(t-1)^{th}$ retransmission.

2. The method of claim 1, wherein before the obtaining information to be transmitted for a $t^{th}$ time, the method further comprises:
determining, by the transmitting device, that reliability of $K_t$ information locations in the $R_t$ extension locations is higher than reliability of $K_t$ information locations with lowest reliability in the information to be transmitted for the $(t-1)^{th}$ time, wherein $M_t$ is equal to $K_t-L_t$.

3. The method of claim 2, wherein $M_t$ and $L_t$ are positively correlated.

4. The method of claim 1, wherein before the obtaining information to be transmitted for a $t^{th}$ time, the method further comprises:
determining, by the transmitting device, that the information to be transmitted for the $t^{th}$ time meets a preset condition, wherein the preset condition comprises one or more of: a code length of the information to be transmitted for the $t^{th}$ time belongs to a first preset range, a code rate of the information to be transmitted for the $t^{th}$ time belongs to a second preset range, or a quantity of the information bits in the extension locations in the information to be transmitted for the $t^{th}$ time belongs to a third preset range.

5. The method of claim 1, wherein the obtaining, by the transmitting device, a codeword for $(t-1)^{th}$ retransmission based on the codeword after the polar encoding comprises:
performing, by the transmitting device, rate matching on the codeword after the polar encoding based on a preset code length and a preset rate matching manner, to obtain a to-be-retransmitted sequence after the matching, wherein the preset rate matching manner comprises one or more of: puncturing rate matching, shortening rate matching, or repetition rate matching; and obtaining, by the transmitting device, the codeword for $(t-1)^{th}$ retransmission based on the to-be-retransmitted sequence after the matching.

6. The method of claim 5, wherein when the preset rate matching manner comprises puncturing rate matching, before the obtaining information to be transmitted for a $t^{th}$ time, the method further comprises:
   determining, by the transmitting device, that the information to be transmitted for the $t^{th}$ time meets a preset condition, wherein the preset condition comprises one or more of: a code length of the information to be transmitted for the $t^{th}$ time belongs to a first preset range, a code rate of the information to be transmitted for the $t^{th}$ time belongs to a second preset range, a quantity of the information bits in the extension locations in the information to be transmitted for the $t^{th}$ time belongs to a third preset range, or a quantity of puncturing bits in the codeword after the polar encoding belongs to a fourth preset range.

7. A data retransmission method, comprising:
   receiving, by a receiving device, a codeword for $(t-1)^{th}$ retransmission sent by a transmitting device, wherein the codeword for $(t-1)^{th}$ retransmission is a retransmitted codeword obtained by the transmitting device based on a codeword after polar encoding that is obtained by information to be transmitted for a $t^{th}$ time, the information to be transmitted for the $t^{th}$ time comprises $R_t$ extension locations and information to be transmitted for a $(t-1)^{th}$ time, and the extension locations comprise $M_t$ information bits and $L_t$ check bits corresponding to the $M_t$ information bits, wherein $R_t$, $M_t$, and $L_t$ are integers greater than 0, t is greater than 1, and $M_t$ is less than $R_t$; and
   performing, by the receiving device, polar decoding on the codeword for $(t-1)^{th}$ retransmission, to obtain a decoding result of codewords for t times of transmission.

8. The method of claim 7, wherein the performing, by the receiving device, polar decoding on the codeword for $(t-1)^{th}$ retransmission, to obtain a decoding result of codewords for t times of transmission comprises:
   performing, by the receiving device, the polar decoding on the codeword for $(t-1)^{th}$ retransmission, to obtain a decoding result of the codeword for $(t-1)^{th}$ retransmission;
   performing, by the receiving device, check decoding on the decoding result of the codeword for $(t-1)^{th}$ retransmission, to obtain a check decoding result; and
   determining, by the receiving device, a reliable decoding path based on the check decoding result, and decoding, based on the reliable decoding path, codewords for first $(t-1)$ times of transmission, to obtain the decoding result of the codewords for the t times of transmission.

9. The method of claim 8, wherein the determining, by the receiving device, a reliable decoding path based on the check decoding result, and decoding, based on the reliable decoding path, codewords for first $(t-1)$ times of transmission comprises:
   determining, by the receiving device, a decoding path with highest reliability based on the check decoding result, and deleting a decoding path other than the decoding path with highest reliability; and
   decoding, based on the decoding path with highest reliability, the codeword for first $(t-1)$ times of transmission.

10. The method of claim 7, wherein reliability of $K_t$ information locations in the R extension locations is higher than reliability of $K_t$ information bits with lowest reliability in the information to be transmitted for the $(t-1)^{th}$ time, wherein $M_t$ is equal to $K_t-L_t$.

11. The method of claim 10, wherein $M_t$ and $L_t$ are positively correlated.

12. The method of claim 7, wherein the information to be transmitted for the $t^{th}$ time meets a preset condition, and the preset condition comprises one or more of: a code length of the information to be transmitted for the $t^{th}$ time belongs to a first preset range, a code rate of the information to be transmitted for the $t^{th}$ time belongs to a second preset range, or a quantity of the information bits in the extension locations in the information to be transmitted for the $t^{th}$ time belongs to a third preset range.

13. The method of claim 7, wherein the codeword for $(t-1)^{th}$ retransmission comprises a retransmitted codeword obtained by the transmitting device based on a codeword after polar encoding that is obtained by information to be transmitted for a $t^{th}$ time comprises: the codeword for $(t-1)^{th}$ retransmission is obtained based on a to-be-retransmitted sequence that is after matching and that is obtained by a codeword on which rate matching is performed in a preset rate matching manner and that is obtained by performing polar encoding on the information to be transmitted for the $t^{th}$ time, wherein the preset rate matching manner is one or more of: puncturing rate matching, shortening rate matching, or repetition rate matching.

14. The method of claim 13, wherein when the preset rate matching manner comprises puncturing rate matching, the information to be transmitted for the $t^{th}$ time meets a preset condition, and the preset condition comprises one or more of: a code length of the information to be transmitted for the $t^{th}$ time belongs to a first preset range, a code rate of the information to be transmitted for the $t^{th}$ time belongs to a second preset range, a quantity of the information bits in the extension locations in the information to be transmitted for the $t^{th}$ time belongs to a third preset range, or a quantity of puncturing bits in the codeword after the polar encoding belongs to a fourth preset range.

15. A data retransmission apparatus, comprising:
   an obtaining module, configured to obtain information to be transmitted for a $t^{th}$ time, wherein the information to be transmitted for the $t^{th}$ time comprises $R_t$ extension locations and information to be retransmitted for a $(t-1)^{th}$ time, and the extension locations comprise $M_t$ information bits and $L_t$ check bits corresponding to the $M_t$ information bits, wherein $R_t$, $M_t$, and $L_t$ are integers greater than 0, t is greater than 1, and $M_t$ is less than $R_t$;
   an encoding module, configured to perform polar encoding on the information to be transmitted for the $t^{th}$ time, to obtain a codeword after the polar encoding;
   a determining module, configured to obtain a codeword for $(t-1)^{th}$ retransmission based on the codeword after the polar encoding; and
   a transmitting module, configured to transmit the codeword for $(t-1)^{th}$ retransmission.

16. The data retransmission apparatus of claim 15, wherein the apparatus further comprises:
   an extension module, configured to: determine that reliability of $K_t$ information locations in the R extension locations is higher than reliability of $K_t$ information bits with lowest reliability in the information to be transmitted for the $(t-1)^{th}$ time before the obtaining module obtains the information to be transmitted for the $t^{th}$ time, wherein $M_t$ is equal to $K_t-L_t$.

17. The data retransmission apparatus of claim 16, wherein $M_t$ and $L_t$ are positively correlated.

18. The data retransmission apparatus of claim 15, wherein the determining module is further configured to determine that the information to be transmitted for the $t^{th}$ time meets a preset condition before the obtaining module obtains the information to be transmitted for the $t^{th}$ time, wherein the preset condition comprises one or more of: a code length of the information to be transmitted for the $t^{th}$ time belongs to a first preset range, a code rate of the information to be transmitted for the $t^{th}$ time belongs to a second preset range, or a quantity of the information bits in the extension locations in the information to be transmitted for the $t^{th}$ time belongs to a third preset range.

19. The data retransmission apparatus of claim 15, wherein the determining module is further configured to: perform rate matching on the codeword after the polar encoding based on a preset code length and a preset rate matching manner, to obtain a to-be-retransmitted sequence after the matching, wherein the preset rate matching manner is one or more of: puncturing rate matching, shortening rate matching, or repetition rate matching; and obtain the codeword for $(t-1)^{th}$ retransmission based on the to-be-retransmitted sequence after the matching.

20. The data retransmission apparatus of claim 19, wherein when the preset rate matching manner comprises the puncturing rate matching, the determining module is further configured to determine that the information to be transmitted for the $t^{th}$ time meets a preset condition before the obtaining module obtains the information to be transmitted for the $t^{th}$ time, wherein the preset condition comprises one or more of: a code length of the information to be transmitted for the $t^{th}$ time belongs to a first preset range, a code rate of the information to be transmitted for the $t^{th}$ time belongs to a second preset range, a quantity of the information bits in the extension locations in the information to be transmitted for the $t^{th}$ time belongs to a third preset range, or a quantity of puncturing bits in the codeword after the polar encoding belongs to a fourth preset range.

* * * * *